US008878305B2

(12) United States Patent
Guo et al.

(10) Patent No.: US 8,878,305 B2
(45) Date of Patent: Nov. 4, 2014

(54) INTEGRATED POWER MODULE FOR MULTI-DEVICE PARALLEL OPERATION

(71) Applicant: Toyota Motor Engineering & Manufacturing North America, Inc., Erlanger, KY (US)

(72) Inventors: Yuanbo Guo, Ann Arbor, MI (US); Sang Won Yoon, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 0 days.

(21) Appl. No.: 13/645,231

(22) Filed: Oct. 4, 2012

(65) Prior Publication Data

US 2014/0097501 A1 Apr. 10, 2014

(51) Int. Cl.
*H01L 27/06* (2006.01)

(52) U.S. Cl.
USPC .................................. 257/379; 257/E27.035

(58) Field of Classification Search
CPC ............................ H01L 23/50; H01L 41/1044
USPC .......................................... 257/379, E27.035
See application file for complete search history.

(56) References Cited

U.S. PATENT DOCUMENTS

| 7,232,710 | B2 * | 6/2007 | Hsu et al. ....................... 438/122 |
| 7,944,042 | B2 * | 5/2011 | Yoshihara et al. ............ 257/693 |
| 8,410,600 | B2 * | 4/2013 | Lostetter et al. .............. 257/700 |
| 2010/0295172 | A1 * | 11/2010 | Gao et al. ....................... 257/712 |
| 2012/0300522 | A1 * | 11/2012 | Tokuyama et al. ........... 363/131 |

OTHER PUBLICATIONS

Dodge; "Eliminating Parasitic Oscillation Between Parallel MOSFETs"; *Application Note APT-0402 Rev A*; 6 pages; Mar. 25, 2004.

Farruggia et al.; "Hybrid Modules as an Alternative to Paralleled Discrete Devices"; International Symposium on Microeletronics; vol. 4587; pp. 399-404, Oct. 9, 2001.

Bontemps et al.; "Low Profile Power Module Combined with state of the Art MOSFET Switches and SiC Diodes Allows High Frequency and Very Compact Three-Phase Sinusoidal Input Rectifiers" Proc. Of the Conf for Power for Power Electronics, Intellectual Motion and Power Quality; 6 pages; 2007.

* cited by examiner

*Primary Examiner* — Zandra Smith
*Assistant Examiner* — Damian A Hillman
(74) *Attorney, Agent, or Firm* — Snell & Wilmer LLP

(57) ABSTRACT

An integrated power module having a dielectric substrate, a source conductor trace formed on the dielectric substrate, a drain conductor trace formed on the dielectric substrate, a gate conductor trace formed on the dielectric substrate, a transistor chip having a top surface and a bottom surface connected to the drain conductor trace, a back-contact resistor having a flat planar structure with a top surface and a bottom surface connected to the gate conductor trace, and a first wire bond connecting the top surface of the transistor chip to the top surface of the back-contact resistor.

20 Claims, 5 Drawing Sheets

INTEGRATED POWER MODULE FOR MULTI-DEVICE PARALLEL OPERATION

BACKGROUND

1. Field

The invention relates to an integrated power module for multi-device parallel operation. More particularly, the invention relates to systems and methods for providing a low parasitic inductance design and a more symmetrical layout design for an integrated power module for multi-device parallel operation.

2. Description of the Related Art

FIG. 1 is a conventional top view power module 100 layout that shows as an example four transistor chips 120 and FIG. 2 is a circuit schematic 200 of the conventional power module 100 shown in FIG. 1. The circuit shown in FIG. 2 is a switch position of any power electronics circuit topology, e.g., half-bridge, full-bridge, etc. Referring to FIGS. 1 and 2, the power module 100 includes a dielectric substrate 105, conductor traces (or pads) 110, four transistor chips 120, and wire bonds 115. The dielectric substrate 105 may be formed of a material such as Alumina, Aluminium Nitride (AlN), Silicon Nitride ($Si_3N_4$), and so on. The conductor traces (or pads) 110 are copper (or aluminum) traces or pads integrated into the dielectric substrate 105. The dielectric substrate 105 is sometimes referred to as Direct Bond Copper (DBC), Direct Bond Aluminum (DBA), or Active Metal Brazing (AMB).

The conductor traces (or pads) 110 are etched to form a source (S) conductor trace (or pad) 125, a drain (D) conductor trace (or pad) 130, and a gate (G) conductor trace (or pad) 135 (from top to bottom). As an example, the transistor chips 120 are shown as MOSFETs. However, other types of transistor chips 120 can be used such as IGBTs, JFETs, BJTs, and so on. Each transistor chip 120 includes at least three electrical conductor traces 110, for example, the source (S) conductor trace 125, the drain (D) conductor trace 130, and the gate (G) conductor trace 135. Each transistor chip 120 is positioned on or mounted onto the drain (D) conductor trace 130. The source (S) conductor trace 125, the drain (D) conductor trace 130, and the gate (G) conductor trace 135 are formed or integrated as conductors 110 on the dielectric substrate 105. Hence, each similar electrical element (e.g., source, drain or gate) shares the same conductor or pad. The conductor traces 110 can be any kind of conducting material attached to or formed on the dielectric substrate 105. As shown in FIGS. 1 and 2, the source (S) conductor trace 125, the drain (D) conductor trace 130, and the gate (G) conductor trace 135 are connected by wire bonds 115 and transistor chips 120. Other types of connectors can be used such as lead frames.

The transistor chips 120 are arranged in a parallel circuit configuration. One drawback of arranging the transistor chips 120 in a parallel configuration is that gate loops are formed between the paralleled transistor chips 120.

FIG. 3 is a circuit schematic 300 of the conventional power module 100 of FIGS. 1 and 2 with gate and source inductances ($L_g$ and $L_s$) shown. The gate voltage to the source voltage of each device 320 is built up at a different speed because of the inherent unbalanced characteristics of the devices 320 and the asymmetric layout. As a result, the conventional power module 100 is prone to suffer gate oscillation as illustrated in FIG. 3. The arrows 325 illustrate an example of the oscillation loops, i.e., the common gate to common source loops. In some configurations, common gate to common drain loops may also be formed. The oscillation occurring at the gate (G) conductor trace 135 may turn on or turn off the transistors 320 accidentally, which may cause the transistors 320 to short-circuit or malfunction.

FIG. 4 is another conventional top view power module 400 layout with separate gate conductor pads 405 and FIG. 5 is a circuit schematic 500 of the conventional power module 400 but the individual gate resistors ($R_g$) are located on a printed circuit board (PCB) and are added in order to complete the loops 525. Referring to FIGS. 4 and 5, the conventional power module 400 divides the gate conductor into separate gate conductor pads 405 and connects each gate pad 405 to a PCB (not shown) by terminal pins or a case (not shown) by wire bonds. At the output terminal of the gate drive board or circuit (usually on top of the power module 400), a gate resistor ($R_g$) is connected to each individual gate terminal to dampen the oscillation, as shown in FIG. 5. Connecting each gate conductor pad 405 to the gate resistor ($R_g$) on the gate drive board or circuit essentially increases the length of the gate loop, and thus increases the total loop inductance ($L_g$ and $L_s$), which are undesirable characteristics for designers.

The above drawbacks provide challenges to designers of integrated power modules. Thus, there is a need for an integrated power module that overcomes the above drawbacks.

SUMMARY

The invention provides a solution to gate loop oscillation when multiple devices are arranged in a parallel circuit configuration. The invention also reduces connector count and allows various layout patterns which may lead to more symmetrical designs and lower parasitic inductance designs.

The invention provides an integrated power module having a dielectric substrate, a source conductor trace formed on the dielectric substrate, a drain conductor trace formed on the dielectric substrate, a gate conductor trace formed on the dielectric substrate, a transistor chip having a top surface and a bottom surface connected to the drain conductor trace, a back-contact resistor having a flat planar structure with a top surface and a bottom surface connected to the gate conductor trace, and a first wire bond connecting the top surface of the transistor chip to the top surface of the back-contact resistor. The back-contact resistor is positioned along a horizontal plane that is substantially parallel to a horizontal plane defined by the transistor chip.

BRIEF DESCRIPTION OF THE DRAWINGS

The features, objects, and advantages of the invention will become more apparent from the detailed description set forth below when taken in conjunction with the drawings, wherein.

DETAILED DESCRIPTION

Apparatus, systems and methods that implement the embodiments of the various features of the invention will now be described with reference to the drawings. The drawings and the associated descriptions are provided to illustrate some embodiments of the invention and not to limit the scope of the invention. Throughout the drawings, reference numbers are re-used to indicate correspondence between referenced elements.

Figure 1:
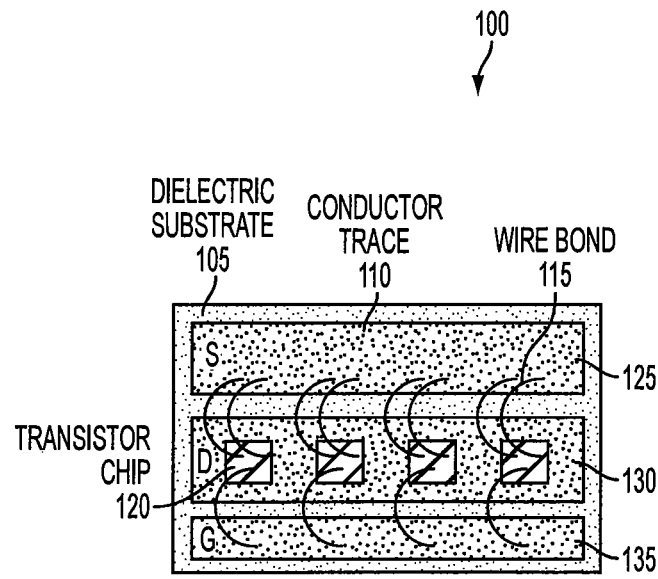
FIG. 1 is a conventional top view power module layout that includes four transistors.
Figure 2:
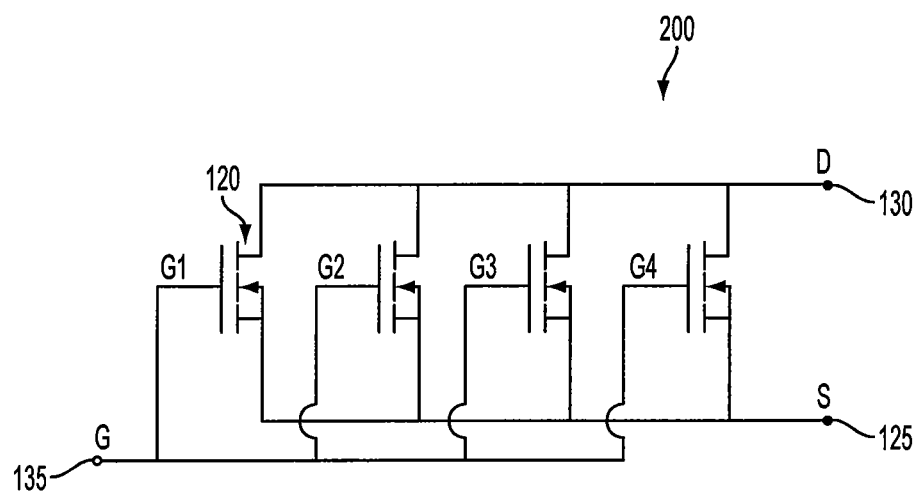
FIG. 2 is a circuit schematic of the conventional power module shown in FIG. 1.
Figure 3:
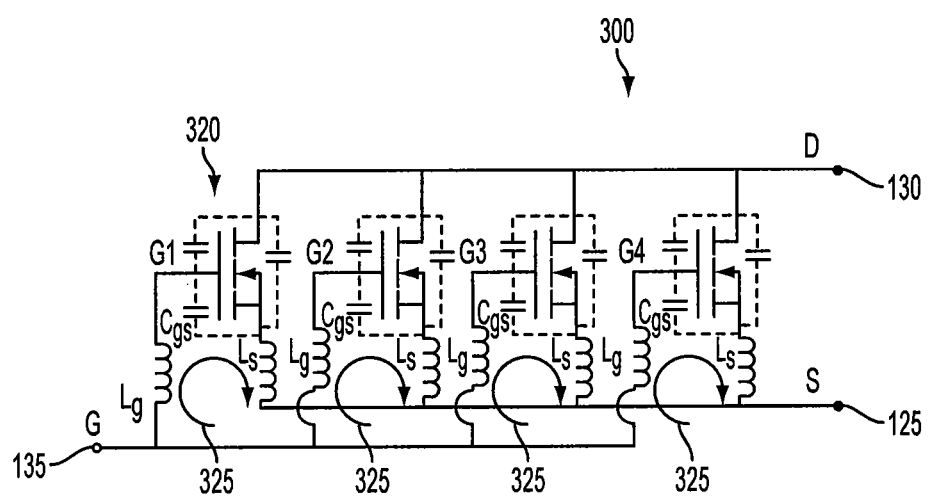
FIG. 3 is a circuit schematic of the conventional power module of FIGS. 1 and 2 with gate and source inductances ($L_g$ and $L_s$) shown.
Figure 4:
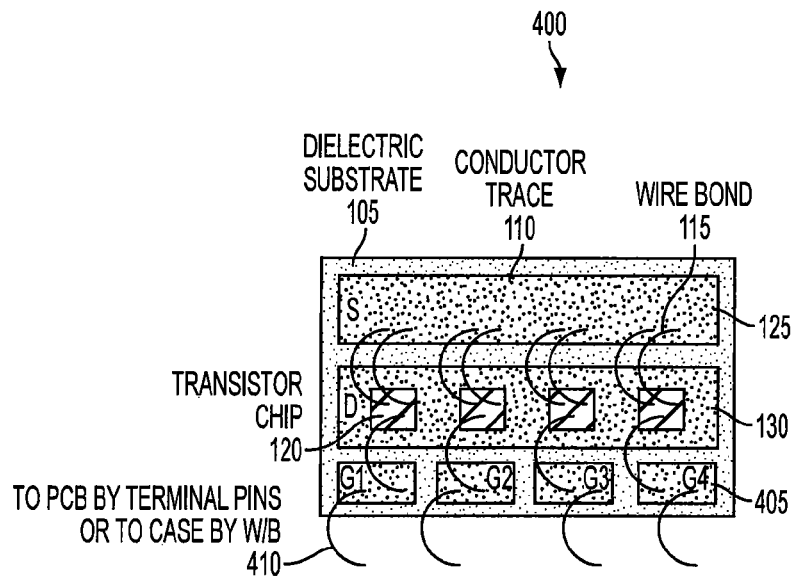
FIG. 4 is another conventional top view power module layout with separate gate conductor pads.
Figure 5:
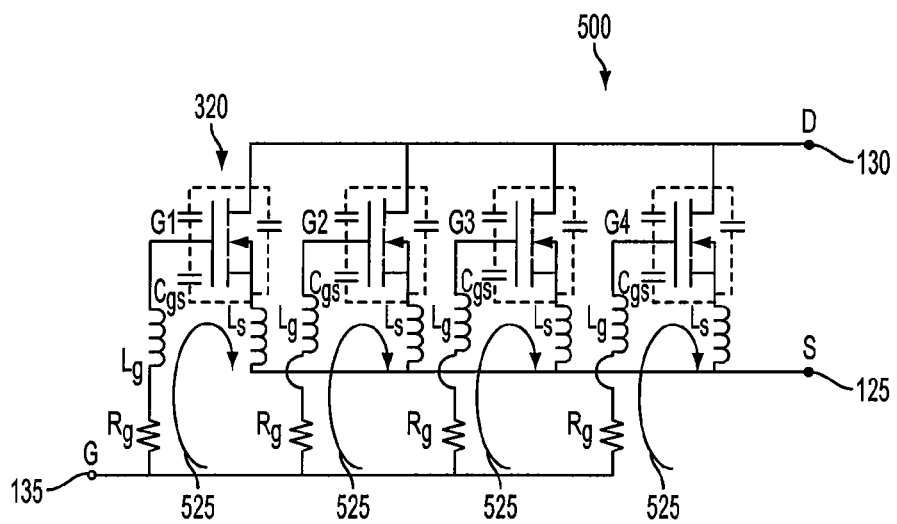
FIG. 5 is a circuit schematic of the conventional power module of FIG. 4 but the individual gate resistors ($R_g$) on a printed circuit board (PCB) are added in order to complete the loops.
Figure 6:
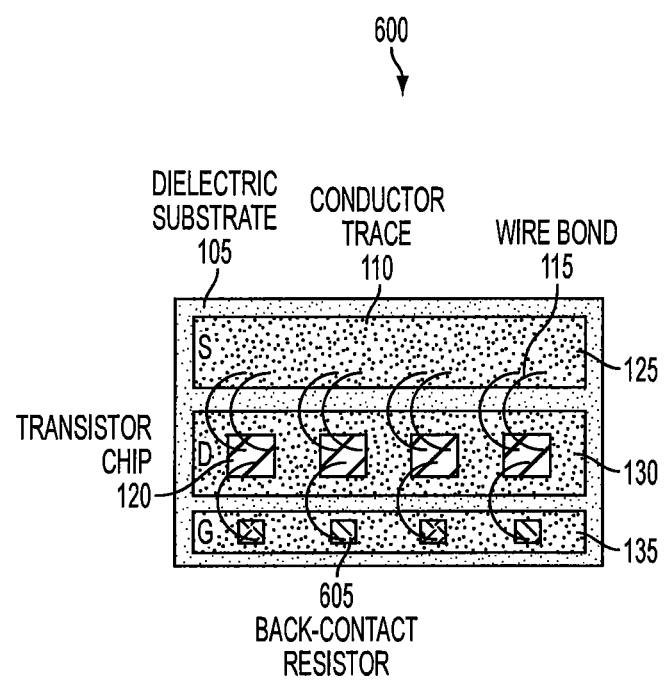
FIG. 6 is a top view of a power module layout with back-contact resistors mounted and/or bonded to the shared gate conductor trace according to an embodiment of the invention.

FIG. 6 is a top view of a power module 600 layout with back-contact resistors 605 mounted and/or bonded to the shared gate conductor trace 135. The back-contact resistors 605 (e.g., planar back-contact gate resistors) can be formed or integrated on the shared gate conductor trace 135 and/or the dielectric substrate 105. Each back-contact resistor 605 has a bottom side or surface for a bonding or soldering connection to the gate conductor trace 135 and a top side or surface for connection to the transistor chip 120 using a wire bond 115. Each back-contact resistor 605 has a flat planar structure. The flat planar structure allows the back-contact resistors 605 to be mounted and/or bonded to the gate conductor trace 135 at the same time or using the same manufacturing process or step as the transistor chip 120 is being mounted and/or bonded to the drain conductor trace 130. For example, the interface material 1 725 may be placed on the drain conductor trace 130 by various methods including deposition, insertion, dispensing, etc. and the gate conductor trace 135 using a single processing or manufacturing step. Next, the transistor chip 120 may be mounted or positioned on the drain conductor trace 130 and the back-contact resistor 605 may be mounted or positioned on the gate conductor trace 135 using a single processing or manufacturing step. Thereafter, the power module 600 is placed into a chamber where the transistor chip 120 and the back-contact resistor 605 are cured using a single processing or manufacturing step. Hence, mounting or bonding the back-contact resistor 605 to the gate conductor trace 135 does not add any additional processing or manufacturing steps as the process of mounting or bonding the transistor chip 120 to the drain conductor trace 130 needs to be performed. Mounting the back-contact resistor 605 and the transistor chip(s) 120 in separate steps is also possible if an alternative assembly method is chosen. For example, Transient Liquid Phase (TLP) bonding process, Nano-Silver bonding process, or solder of different melting temperature may be used. Also, mounting or bonding the back-contact resistor 605 to the gate conductor trace 135 reduces the oscillation and the ringing (drawbacks described above). The power module 600 has a symmetrical design and better thermal and electrical performance and has a shared gate conductor trace 135 without the gate resistors causing or producing ringing between the devices.

The value of the back-contact resistor ($R_g$) 605 is typically between about 1 ohm and 5 ohms and preferably about 2 ohms, which is less than the value of conventional gate resistance. The reduction in the value of the back-contact resistor 605 results in a faster switching speed for the transistor chip 120.

Figure 7:
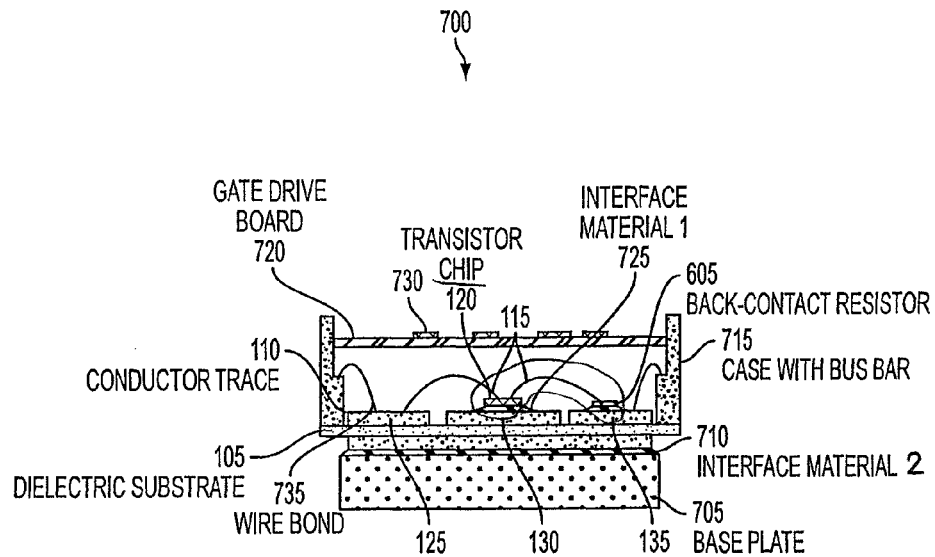
FIG. 7 is a cross-sectional side view of a gate drive board (e.g., a PCB) positioned above and spaced apart from the power module of FIG. 6 where wire bonds are used to connect the conductor traces to a case with a bus bar according to an embodiment of the invention.

FIG. 7 is a cross-sectional side view of an integrated power module 700 having a gate drive board 720 (e.g., a printed circuit board) positioned above and spaced apart from the power module 600 where wire bonds 735 are used to connect the conductor traces 110 to a case 715 with a bus bar. The bus bar may be a copper or aluminum conductor. The integrated power module 700 may include a base plate 705 (e.g., a substrate), interface material 2 710 applied to a top surface of the base plate 705, and the dielectric substrate 105 attached to the base plate 705 using the interface material 2 710. The conductor traces 110 are identified as the source (S) conductor trace 125, the drain (D) conductor trace 130, and the gate (G) conductor trace 135 (from left to right). The source conductor trace 125, the drain conductor trace 130, and the gate conductor trace 135 all lie along the same horizontal plane as shown in FIG. 7. The transistor chip 120 is mounted and/or bonded to the drain (D) conductor trace 130 using interface material 1 725. The interface material 1 725 and the interface material 2 710 are bonding materials.

The back-contact resistor 605 is mounted and/or bonded to the gate (G) conductor trace 135 using interface material 1 725. A wire bond 115 is used to connect the transistor chip 120 to the back-contact resistor 605. Mounting the back-contact resistor 605 to the gate conductor trace 135 minimizes the length or distance from the transistor chip 120 to the back-contact resistor 605 thus advantageously reducing the total loop inductance ($L_g$ and $L_s$) and oscillation. The wire bond 115 is generally connected after the curing of the interface material 1 725.

The case 715 is connected to the dielectric substrate 105. The case 715 has side vertical walls positioned substantially perpendicular to a horizontal plane defined by the dielectric substrate 105. The case 715 may be made of a plastic or metal material. Screws or fasteners may be used to connect the case 715 to the dielectric substrate 105. The bus bar may be integrated into the case 715 and may be one or more insulated wires. A wire bond 115 is used to connect the gate conductor trace 135 to the bus bar.

In one embodiment, the gate drive board 720 is positioned above and spaced apart from the dielectric substrate 105 by a vertical distance of between about 0.5 centimeters to about 1 centimeter. The gate drive board 720 is positioned along a plane that is substantially parallel to a plane defined by the dielectric substrate 105. The gate drive board 720 is connected to the case 715 using screws or fasteners. The gate drive board 720 and the components thereon are electrically connected to the bus bar in the case 715. The components (e.g., chips 730) on the gate drive board 720 are used to control the power module 600.

Figure 8:
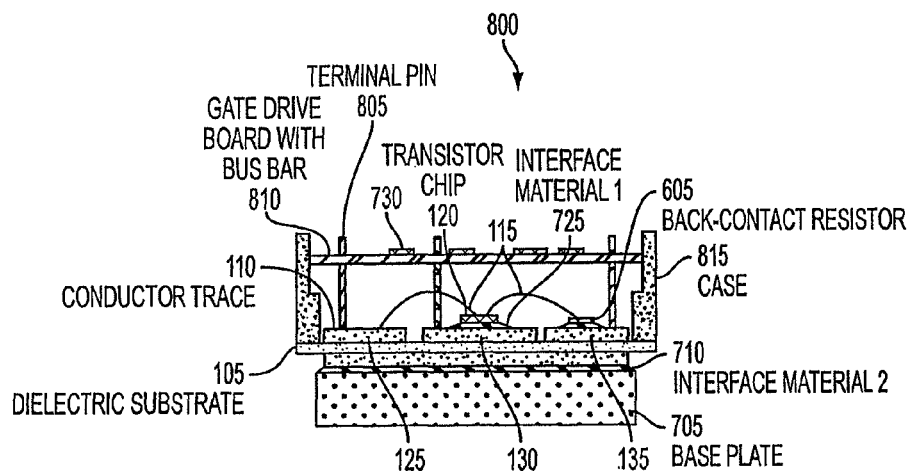
FIG. 8 is a cross-sectional side view of an integrated power module having a gate drive board (e.g., a PCB) positioned above and spaced apart from the power module where terminal pins are used to connect the conductor traces to the gate drive board according to an embodiment of the invention.

FIG. 8 is a cross-sectional side view of an integrated power module 800 having a gate drive board 810 (e.g., a PCB) positioned above and spaced apart from the power module 600 where terminal pins 805 are used to connect the conductor traces 110 to the gate drive board 810. The gate drive board 810 may include a bus bar as described above. The case 815 does not include the bus bar as described above for FIG. 7 because the terminal pins 805 provide the connections between the conductor traces 110 and the gate drive board 810. The terminal pins 805 shorten the distance from the conductor traces 110 to the gate drive board 810 when compared to the approach shown in FIG. 7 using wire bonds. The shortened distance also reduces the total loop inductance ($L_g$ and $L_s$) and oscillation and provides faster switching speeds for the transistor chip 120.

Referring to FIGS. 7 and 8, the gate loops between paralleled devices are maintained at minimum length when the gate conductor pads are connected directly on the dielectric substrate 105. There is no additional restriction on the gate conductor pad locations when designing the power module 600 layout because only one gate terminal is needed per switch position. The invention enables more symmetric layout and more efficient use of the space on the dielectric substrate 105. The invention simplifies the wire routing on the dielectric substrate 105, the housing case 715, and the gate drive board 720 (or 810) because only one gate signal terminal is needed.

The invention also enhances the reliability of the power module 600 because only one terminal pin is needed per gate position. The gate loop between paralleled devices is minimized, so the parasitic inductance is minimized as well. The invention enables more symmetric layout and more efficient use of the space on the dielectric substrate 105. The invention eliminates the gate conductor pads location restrictions when designing the layout pattern. The gate drive layout and power module layout becomes compatible with traditional layout techniques. Gate resistor clamping diodes can also be integrated onto the dielectric substrate 105.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. An integrated power module comprising:
a dielectric substrate;
a source conductor trace formed on the dielectric substrate;
a drain conductor trace formed on the dielectric substrate;
a gate conductor trace formed on the dielectric substrate;
a transistor chip having a top surface and a bottom surface connected to the drain conductor trace;
a back-contact resistor having a flat planar structure with a top surface and a bottom surface connected to the gate conductor trace and mounted directly on or positioned directly on the gate conductor trace; and
a first wire bond connecting the top surface of the transistor chip to the top surface of the back-contact resistor.

2. The integrated power module of claim 1 wherein the source conductor trace is spaced apart from and not in electrical contact with the drain conductor trace.

3. The integrated power module of claim 2 wherein the drain conductor trace is spaced apart from and not in electrical contact with the gate conductor trace.

4. The integrated power module of claim 1 wherein the source conductor trace, the drain conductor trace, and the gate conductor trace all lie along the same horizontal plane.

5. The integrated power module of claim 1 further comprising a case connected to the dielectric substrate, the case having side vertical walls positioned substantially perpendicular to a horizontal plane defined by the dielectric substrate.

6. The integrated power module of claim 5 further comprising a bus bar integrated into the case.

7. The integrated power module of claim 6 further comprising a second wire bond connecting the gate conductor trace to the bus bar.

8. The integrated power module of claim 1 further comprising a gate board drive having a bus bar, the gate drive board being positioned along a plane that is substantially parallel to a plane defined by the dielectric substrate.

9. The integrated power module of claim 8 further comprising a terminal pin connecting the gate conductor trace to the bus bar.

10. The integrated power module of claim 9 further comprising a chip positioned on the gate board drive and connected to the bus bar for controlling the transistor chip.

11. An integrated power module comprising:
a dielectric substrate;
a source conductor trace formed on the dielectric substrate;
a drain conductor trace formed on the dielectric substrate;
a gate conductor trace formed on the dielectric substrate;
a transistor chip having a top surface and a bottom surface connected to the drain conductor trace;
a back-contact resistor having a flat planar structure with a top surface and a bottom surface connected to the gate conductor trace and mounted directly on or positioned directly on the gate conductor trace, the back-contact resistor being positioned along a horizontal plane that is substantially parallel to a horizontal plane defined by the transistor chip; and
a first wire bond connecting the top surface of the transistor chip to the top surface of the back-contact resistor.

12. The integrated power module of claim 11 wherein the source conductor trace is spaced apart from and not in electrical contact with the drain conductor trace.

13. The integrated power module of claim 12 wherein the drain conductor trace is spaced apart from and not in electrical contact with the gate conductor trace.

14. The integrated power module of claim 11 wherein the source conductor trace, the drain conductor trace, and the gate conductor trace all lie along the same horizontal plane.

15. The integrated power module of claim 11 further comprising a case connected to the dielectric substrate, the case having side vertical walls positioned substantially perpendicular to a horizontal plane defined by the dielectric substrate.

16. The integrated power module of claim 15 further comprising a bus bar integrated into the case.

17. The integrated power module of claim 16 further comprising a second wire bond connecting the gate conductor trace to the bus bar.

18. The integrated power module of claim 11 further comprising a gate board drive having a bus bar, the gate drive board being positioned along a plane that is substantially parallel to a plane defined by the dielectric substrate.

19. The integrated power module of claim 18 further comprising a terminal pin connecting the gate conductor trace to the bus bar.

20. The integrated power module of claim 19 further comprising a chip positioned on the gate board drive and connected to the bus bar for controlling the transistor chip.

* * * * *